United States Patent
Ashish (10) Patent No.: US 7,835,478 B2
(45) Date of Patent: Nov. 16, 2010

(54) METHOD AND APPARATUS FOR PERFORMING ANALOG-TO-DIGITAL CONVERSION IN RECEIVER SUPPORTING SOFTWARE DEFINED MULTI-STANDARD RADIOS

(75) Inventor: Pandharipande Ashish, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1048 days.

(21) Appl. No.: 11/592,384

(22) Filed: Nov. 3, 2006

(65) Prior Publication Data

US 2007/0098065 A1    May 3, 2007

Related U.S. Application Data

(60) Provisional application No. 60/732,948, filed on Nov. 3, 2005.

(30) Foreign Application Priority Data

Jun. 2, 2006   (KR) ..................... 10-2006-0050084

(51) Int. Cl.
*H04B 1/10* (2006.01)
*H03M 1/12* (2006.01)

(52) U.S. Cl. ...................... 375/350; 341/155

(58) Field of Classification Search ............... 375/120, 375/126, 155, 316, 350; 370/484; 341/120, 341/126, 155

See application file for complete search history.

(56) References Cited

U.S. PATENT DOCUMENTS

| | | | | |
|---|---|---|---|---|
| 5,568,142 A * | 10/1996 | Velazquez et al. | ........... | 341/126 |
| 6,177,893 B1 * | 1/2001 | Velazquez et al. | ........... | 341/118 |
| 6,339,390 B1 * | 1/2002 | Velazquez et al. | ........... | 341/120 |
| 6,380,879 B2 * | 4/2002 | Kober et al. | ................ | 341/155 |
| 6,441,764 B1 * | 8/2002 | Barron et al. | ............... | 341/155 |
| 6,549,151 B1 * | 4/2003 | Kober et al. | ................ | 341/141 |

* cited by examiner

*Primary Examiner*—Khanh C Tran
(74) *Attorney, Agent, or Firm*—NSIP Law (57) ABSTRACT

Disclosed are an analog-to-digital conversion method and apparatus capable of reducing quantization distortion in a receiver supporting multi-standard radios for which digital signal processing must be differently performed. The analog-to-digital conversion apparatus includes a first filter for filtering an input analog signal into a plurality of sub-band signals, a down-sampler for down-sampling the sub-band signals, a sub-band processor for allocating quantization bits for the sub-band signals, respectively, and digitizing the sub-band signals by using the allocated quantization bits, an up-sampler for up-sampling the digitized sub-band signals, and a second filter for reconstructing the sub-band signals into one digital signal. Multi-standard radio signals can be processed into digital signals in a receiver to which SDR is applied, and quantization distortion can be reduced during a procedure of converting the radio signal into the digital signal.

6 Claims, 7 Drawing Sheets

METHOD AND APPARATUS FOR PERFORMING ANALOG-TO-DIGITAL CONVERSION IN RECEIVER SUPPORTING SOFTWARE DEFINED MULTI-STANDARD RADIOS

PRIORITY

This application claims priority to a provisional application entitled "Method for Analog-to-Digital Conversion in Software Defined Multi-Standard Radios" filed in the US Patent and Trademark Office on Nov. 3, 2005 and assigned Ser. No. 60/732,948, and an application entitled "Method and Apparatus for Performing Analog-to-Digital Conversion in Receiver Supporting Software Defined Multi-Standard Radios" filed in the Korean Industrial Property Office on Jun. 2, 2006 and assigned Serial No. 2006-50084, the contents of which are incorporated herein by reference.

BACKGROUND OF THE INVENTION

1. Field of the Invention

The present invention relates to an analog-to-digital conversion method and apparatus, and more particularly to an analog-to-digital conversion method and apparatus that are capable of reducing the quantization distortion of a received signal in a receiver supporting multi-standard radios in which digital signal processing is performed in different ways from each other.

2. Description of the Related Art

In general, an Analog-to-Digital Converter (hereinafter referred to as "ADC") refers to a device for converting an analog input signal into a digital signal. Various communication equipment or measuring equipment requiring digital signal processing require an ADC in order to perform signal conversion. One such typical communication equipment using the ADC is a receiver of a wireless communication system, such as a cellular phone, a mobile Internet terminal (hereinafter referred to as "mobile terminal) and the like. The ADC is placed between an RF end and a digital signal processing end of a mobile terminal so as to convert an input analog signal into a digital signal.

A Software Defined Radio (hereinafter referred to as "SDR"), which has recently come into notice as a next-generation platform for wireless communication, aims at supporting various standards such as a Wireless Local Area Network (WLAN), a Wireless Personal Area network (WPAN), etc. by installing or downloading software complying to a corresponding standard, instead of replacing hardware. In a transceiver such as an SDR system, digital processing of a received signal must be carried out pursuant to a corresponding radio standard.

Hereinafter, the SDR is discussed in more detail. The SDR refers to a technology for controlling the radio characteristics such as a frequency band, a modulation/demodulation scheme, output power, etc. of a transceiver, through new software installed or downloaded on the spot where a radio device is used without replacing hardware. In the existing wireless communication system, hardware must be replaced in order to change such radio characteristics, which involves a long time-to-market. Although the International Organization for Standardization of wireless communication has proposed various standards and recommended that every country adopt these standards, it is impossible to provide communication between 3G devices employing different standards.

Nevertheless, if radio characteristics such as frequency band, modulation/demodulation scheme, etc. can be controlled through the installation or download of software, it may be possible to provide communication between a mobile terminal and a base station by equipping them with such software even if they employ different radio standards. Further, it may be possible for a person carrying a SDR terminal to communicate anytime with those who carry devices employing different radio standards in other areas.

However, when such a SDR terminal receives a radio signal and converts it into a digital signal, it may be problematic in that a narrowband interference or Additive White Gaussian Noise (AWGN) may occur. On this account, an ADC provided in the SDR terminal must satisfy wideband signal processing, a high sampling rate, good resolution, low quantization distortion and the like in order to enable flexible digital signal processing. Therefore, there is a desire to develop an ADC capable of ensuring good performance to a SDR terminal.

SUMMARY OF THE INVENTION

Accordingly, the present invention has been made to solve at least the above-mentioned problems occurring in the prior art, and an object of the present invention is to provide a method and an apparatus for performing analog-to-digital conversion in a receiver of a wireless communication system in such a manner that an input analog signal is divided into a plurality of sub-band signals and then the plurality of sub-band signals are converted into one digital signal.

A further object of the present invention is to provide an analog-to-digital conversion method and apparatus, which can optimally adjust a sampling rate and a quantization bit according to the waveforms of input signals in a receiver of a wireless communication system.

A further object of the present invention is to provide an analog-to-digital conversion method and apparatus, which can reduce quantization distortion in a receiver supporting software defined multi standard radios.

In order to accomplish these objects, and in accordance with one aspect of the present invention, there is provided a method for performing analog-to-digital conversion in a receiver supporting software defined multi-standard radios, the method includes filtering an input analog signal into a plurality of sub-band signals; down-sampling the sub-band signals; allocating quantization bits for the sub-band signals, respectively, and digitalizing the sub-band signals by using the allocated quantization bits; up-sampling the digitalized sub-band signals; and reconstructing the sub-band signals into one digital signal.

In accordance with another aspect of the present invention, there is provided an apparatus for performing analog-to-digital conversion in a receiver supporting software defined multi-standard radios, the apparatus includes a first filter unit for filtering an input analog signal into a plurality of sub-band signals; a down-sampler unit for down-sampling the sub-band signals; a sub-band processor unit for allocating quantization bits for the sub-band signals, respectively, and digitalizing the sub-band signals by using the allocated quantization bits; an up-sampler unit for up-sampling the digitalized sub-band signals; and a second filter unit for filtering the sub-band signals in such a manner that the sub-band signals are reconstructed into one digital signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. It should be noted that similar components are designated by similar reference numerals although they are illustrated in different drawings. Also, in the following description, a detailed description of known functions and configurations incorporated herein will be omitted when it may obscure the subject matter of the present invention.

Briefly, the basic concept of the present invention is explained. The present invention provides an analog-to-digital conversion method in which an input analog signal is converted into a plurality of sub-band signals and then the plurality of sub-band signals is converted into one digital signal. By converting a plurality of sub-band signals into a digital signal in this way, quantization distortion can be minimized. Here, the levels of quantization for the plurality of sub-band signals are determined based on their signal power. A technology for performing signal processing in units of a sub-band during analog-to-digital conversion, as used herein, may be used in combination with adaptive signal processing for the application of SDR.

Figure 1:
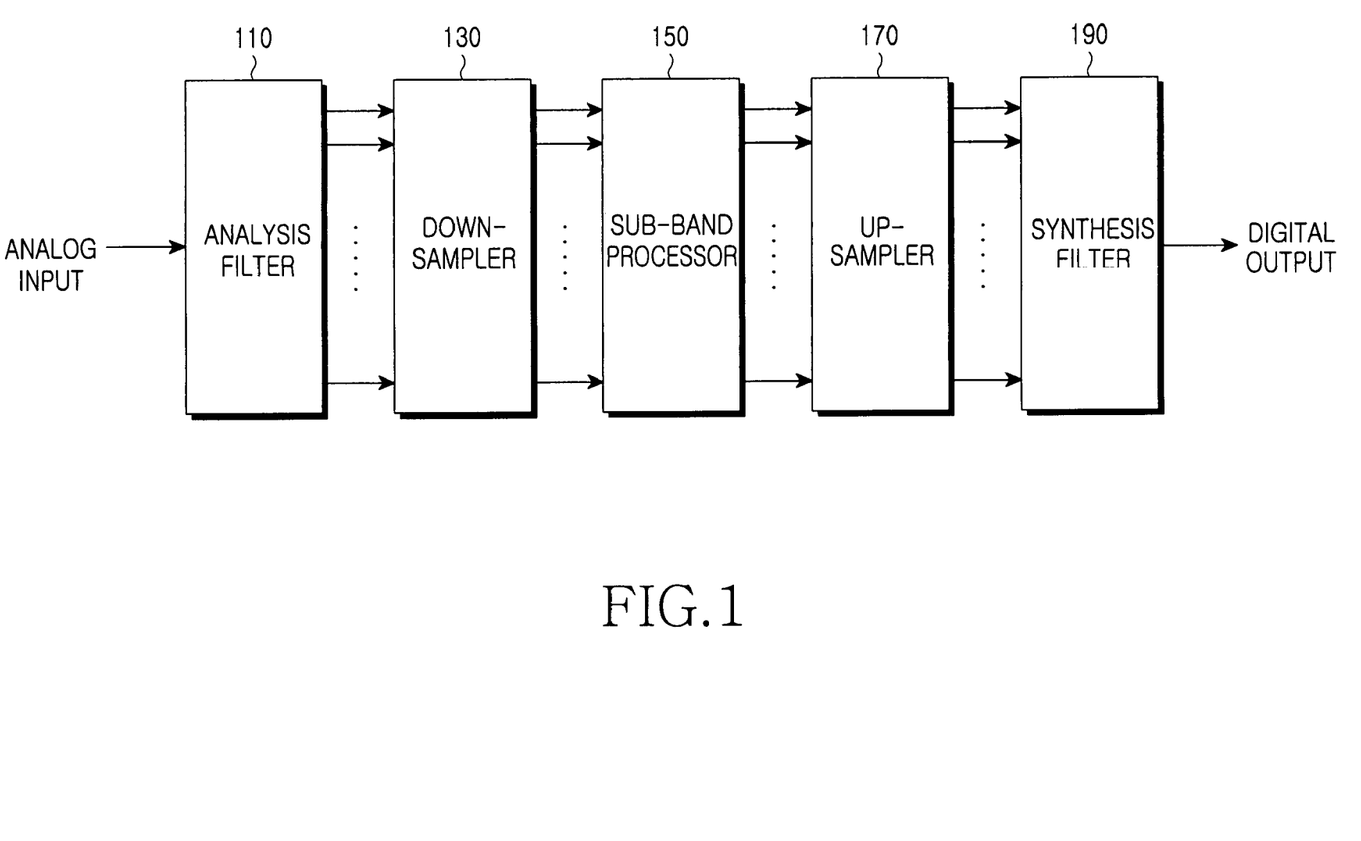
FIG. 1 is a functional block diagram illustrating a structure of an ADC, which is provided in a receiver of a terminal supporting SDR, in accordance with the present invention.

Referring to FIG. 1, an analysis filter unit 110 filters an input analog signal into a plurality of sub-band signals, and outputs the plurality of sub-band signals to a down-sampler unit 130. The down-sampler unit 130 down-samples the plurality of sub-band signals input therein so as to maintain critical sampling. Based on a variance of the sub-band signals output from the down sampler unit 130, a sub-band processor unit 150 allocates bits for digitalizing the respective sub-band signals, and digitalizes the sub-band signals by using the allocated bits. An up-sampler unit 170 up-samples the sub-band signals digitalized through the sub-band processor unit 150, and outputs the up-sampled sub-band signals to a synthesis filter unit 190. The synthesis filter unit 190 reconstructs the plurality of up-sampled sub-band signals into one digital signal, and outputs the reconstructed digital signal.

To facilitate the understanding of the present invention, reference will now be made to an ADC quantization noise model and a model for signal distortion occurring in the course of analog-to-digital conversion with reference to FIGS. 2A and 2B.

Figure 2A:
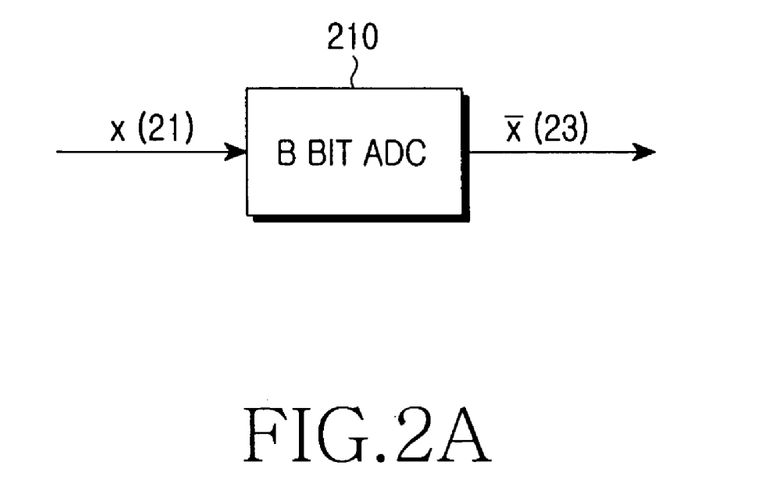
FIGS. 2A and 2B are block diagrams for explaining ADC quantization noise and signal distortion.
Figure 2B:
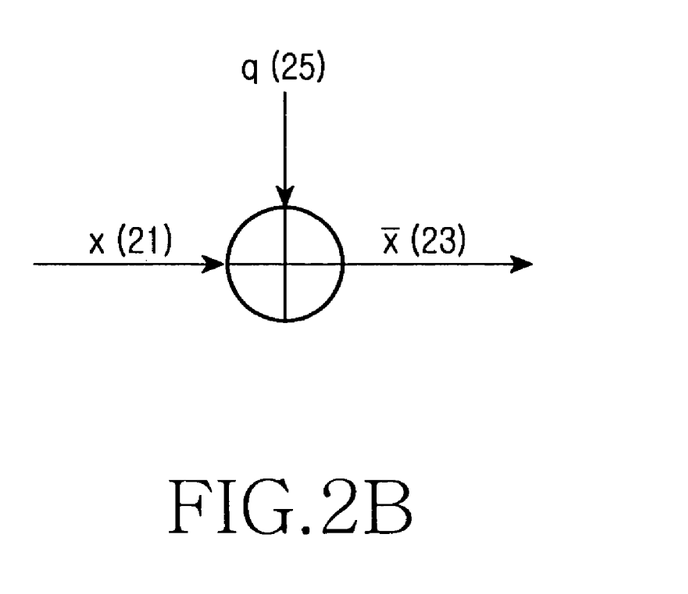

Referring first to FIG. 2A, there is supposed a situation where an analog signal x is converted into a digital signal $\bar{x}$ through a b-bit ADC 210. FIG. 2B illustrates a path by way of which a quantization error 25 (designated by symbol "q") occurs. Here, a variance of the quantization error 25 is expressed by the following Equation 1:

$$\sigma_q^2 = c2^{-2b}\sigma_x^2 \qquad (1)$$

In Equation 1, c denotes a constant, which depends on a distribution of the input analog signal, q denotes quantization error and b denotes the resolution of the ADC.

Let r(t) be an input signal, and let a variance of the input signal r(t) be $\sigma_r^2$. If conventional direct analog-to-digital conversion is performed for the input signal r(t) in an environment supporting a plurality of standards, as in the SDR, quantization distortion $D_{PCM}$ as given in the following Equation 2 is generated:

$$D_{PCM} = c2^{-2b}\sigma_r^2 \qquad (2)$$

Hereinafter, an ADC according to the present invention, which has the structure shown in FIG. 1, will be described in more detail with reference to FIG. 3.

Figure 3:
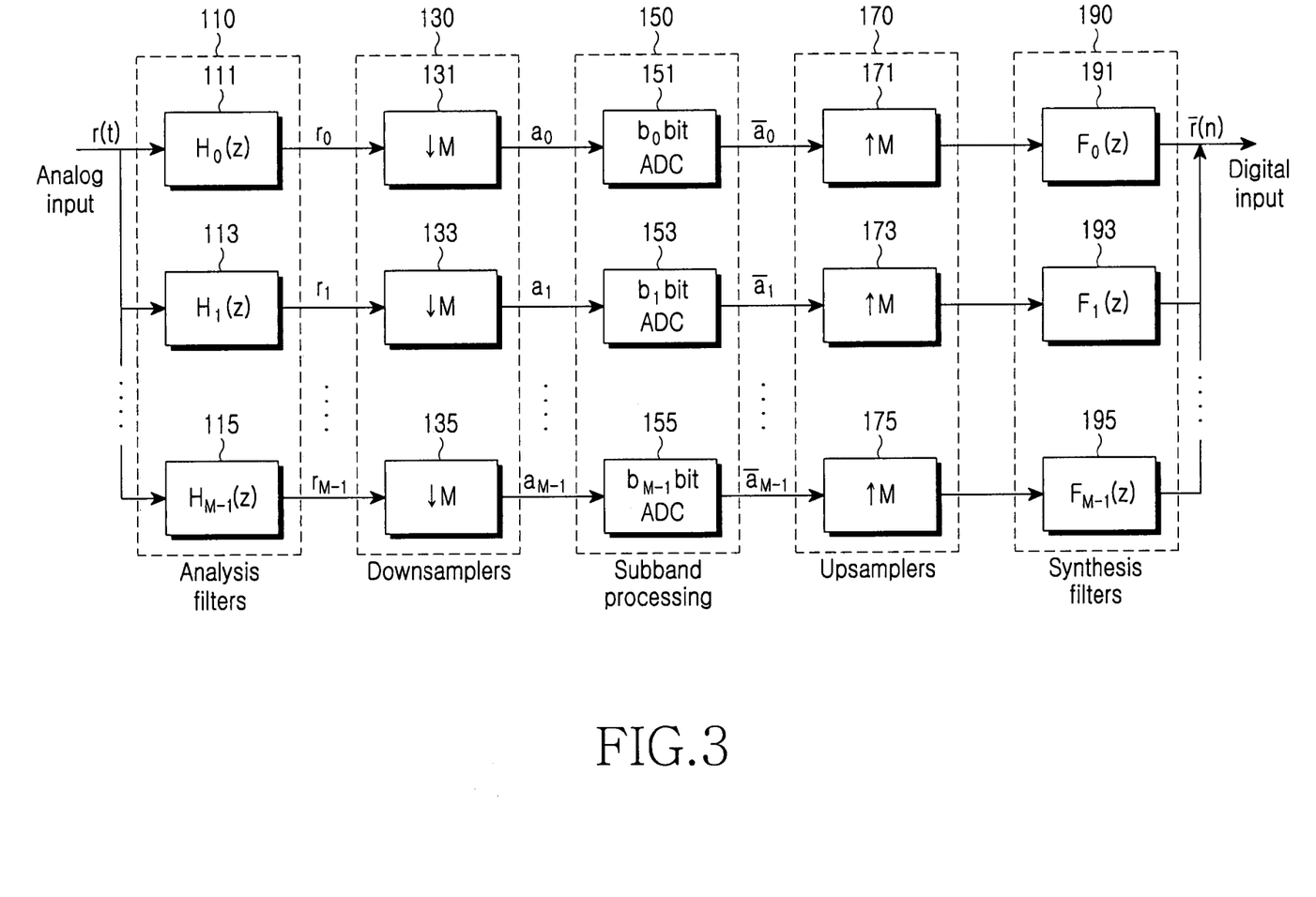
FIG. 3 is a functional block diagram illustrating the structure of the ADC of FIG. 1 in more detail.

In FIG. 3, the same parts as those in FIG. 1 are designated by the same reference numerals, and will not be described in order to avoid a repetitive description.

Referring to FIG. 3, an input signal r(t) is a stationary analog signal sampled at a Nyquist frequency of $f_s$, and analog samples are defined as: r(nT), $T=1/f_s$. The input signal r(t) is assumed as a signal supporting a plurality of standards, as in the SDR.

In FIG. 3, the analysis filter unit 110 includes a plurality of analysis filters 111, 113, ..., 115 which have filter transfer functions $H_0(Z)$ to $H_{M-1}(Z)$, respectively. The plurality of analysis filters 111, 113, ..., 115 analyzes the input signal r(t) into sub-band signals $r_0$ to $r_{M-1}$ the number of which corresponds to that of the analysis filters 111, 113, ..., 115. Further, the down-sampler unit 130 includes a plurality of down-samplers 131, 133, ..., 135 which serve to lower the sampling rate of the sub-band signals, which will be input into the sub-band processor unit 150, to $f_s/M$. In FIG. 3, $a_0$ to $a_{M-1}$ denote analog sub-band signals which are sampled at a sampling rate of $f_s/M$ and then are input into a plurality of ADCs 151, 153, ..., 155 included in the sub-band processor unit 150.

In FIG. 3, the plurality of ADCs 151, 153, ..., 155 convert the input analog sub-band signals into digital sub-band signals. With respect to this, in the respective ADCs 151, 153, ..., 155, quantization bits $b_0$ to $b_{M-1}$ are determined such that quantization error is minimized. The digital sub-band signals, output from the plurality of ADCs 151, 153, ..., 155, are up-sampled and output through a plurality of up-samplers 171, 173, ..., 175 included in the up-sampler unit 170. Finally, as illustrated in FIG. 3, a plurality of synthesis filters 191, 193, ..., 195, which are included in the synthesis filter unit 190 and have filter transfer functions $F_0(Z)$ to $F_{M-1}(Z)$, respectively, reconstruct the up-sampled digital sub-band signals into one digital signal, and output the reconstructed digital signal.

Figure 4:
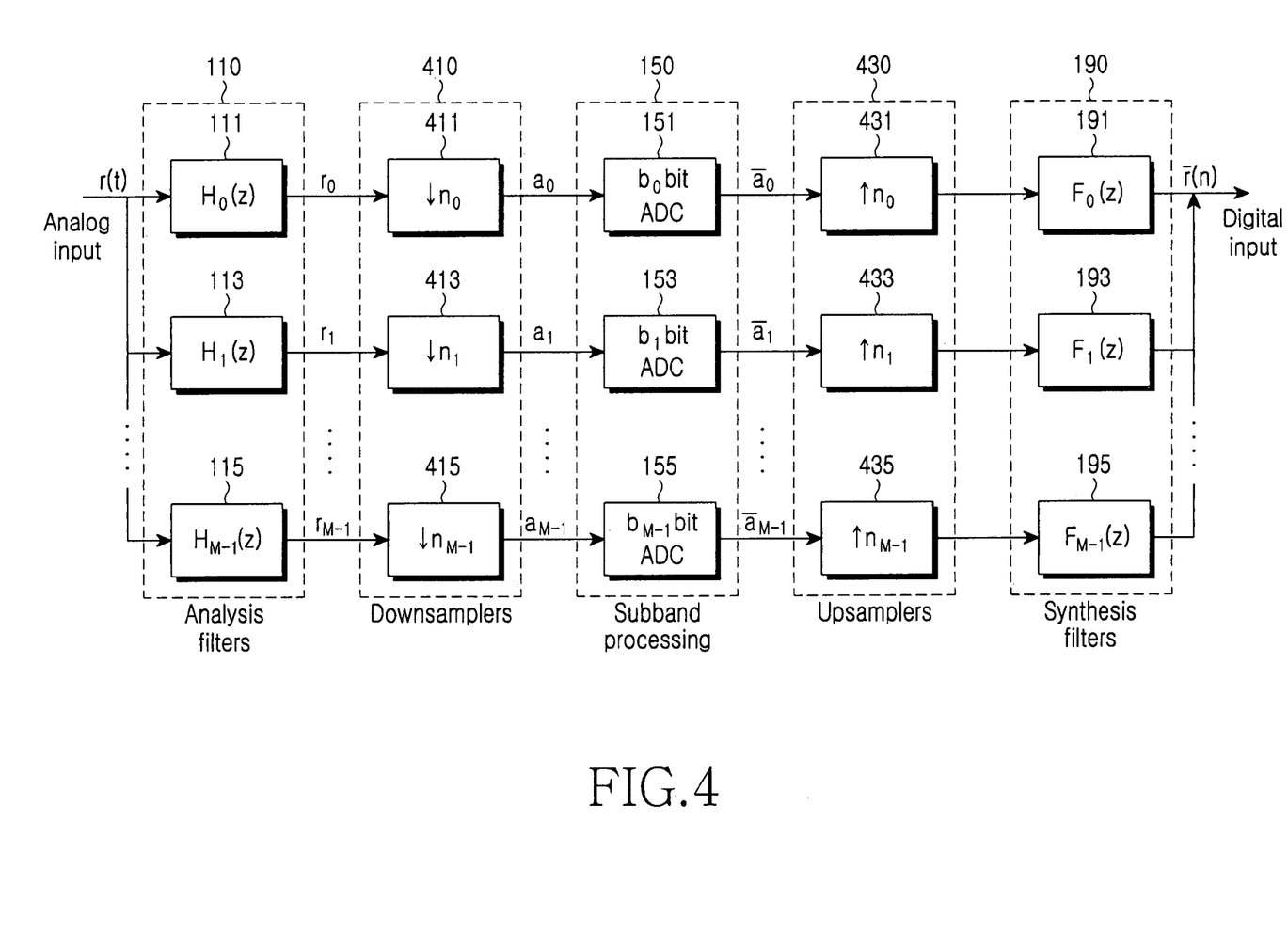
FIG. 4 is a functional block diagram illustrating a detailed structure of an ADC in accordance with the present invention.

FIG. 4 illustrates a variant of the ADC shown in FIG. 3. In this variant, a down-sampler unit 410 and an up-sampler unit 430 corresponding to the down-sampler unit 130 and the up-sampler unit 170 in FIG. 3 raise/lower the sampling rate of the sub-band signals at the rates of $n_0$ to $n_{M-1}$, so as to perform optimal bit allocation to the plurality of ADCs 151, 153, ..., 155, thereby minimizing the average quantization error $D_{HFB}$. Here, assuming $n_0$ to $n_{M-1}$ as $n_k$, the average quantization error $D_{HFB}$ is derived as follows, that is, the average quantization error of the ADC (or ADC system) according to the present invention is expressed by the following Equation 3:

$$D_{HFB} = \sum_{k=0}^{M-1} \frac{\varepsilon\{(\bar{a}_k - a_k)^2\}}{n_k} \quad (3)$$

$$= \sum_{k=0}^{M-1} \frac{\sigma_{q_k}^2}{n_k}$$

$$= c \sum_{k=0}^{M-1} \frac{2^{-2b_k} \sigma_{r_k}^2}{n_k}$$

In Equation 3, since respective variables are the same as symbols represented on respective signal paths in FIG. 3, a description thereof will be omitted. In Equation 3, $\bar{a}_k$ denotes a digital sub-band output from each of ADC 151, 153, ..., 155, M denotes the number of sub-band signals, c is a constant, and n denotes a sampling rate of each down-sampler and up-sampler.

In the present invention, KKT (Karush-Kuhn-Tucker) optimization may be used for minimizing the average quantization error $D_{HFB}$, given in Equation (3), according to a constant bit rate $$\sum_{k=0}^{M-1} \frac{b_k}{n_k} = b.$$

In the KKT optimization, the optimal bit allocation to the ADCs 151, 153, ..., 155 is performed using bits derived from the following Equation 4:

$$b_k = b + \frac{1}{2} \log_2 \left[ \frac{\sigma_{r_k}^2}{\prod_{j=0}^{M-1} (\sigma_{r_j}^2)^{1/n_k}} \right] \quad (4)$$

Further, the average quantization error $D_{HFB}$ minimized according to this embodiment of the present invention can be obtained using the following Equation 5:

$$D_{HFB-min} = c2^{-2b} \prod_{k=0}^{M-1} (\sigma_{r_k}^2)^{1/n_k} \quad (5)$$

Further, a performance gain $G_D$ of the ADC system according to the present invention can be given by the following Equation 6:

$$G_D = 10 \log_{10} \left[ \frac{D_{PCM}}{D_{HFB-min}} \right] \quad (6)$$

$$= 10 \log_{10} \left[ \frac{\sigma_r^2}{\prod_{k=0}^{M-1} (\sigma_{r_k}^2)^{1/n_k}} \right]$$

-continued $$= 10 \log_{10} \left[ \frac{\prod_{k=1}^{M-1} \sigma_{r_k}^2 / n_k}{\prod_{k=0}^{M-1} (\sigma_{r_k}^2)^{1/n_k}} \right]$$

In Equation 6, the gain $G_D$ is a function of the number of the sub-bands, M, and increases as M increases. The gain $G_D$ also depends on characteristics of an input signal, and has a value of 0 for a signal with flat spectral density.

Figure 6:
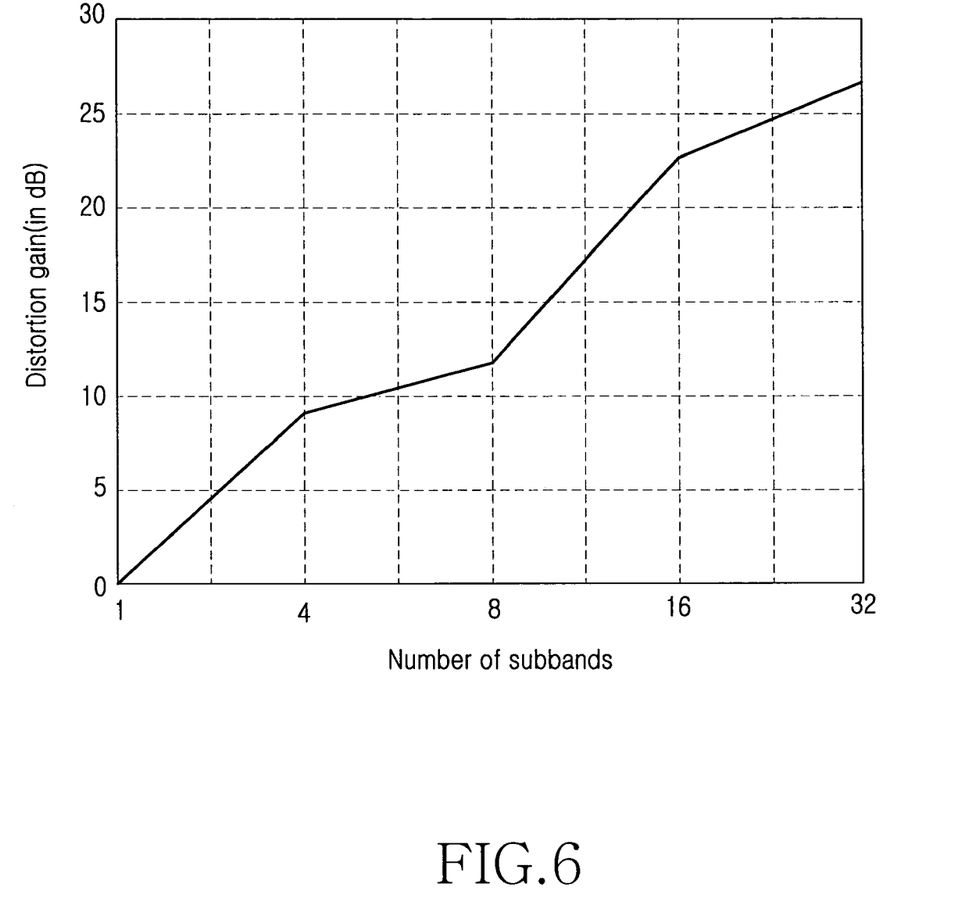
Figure 7:
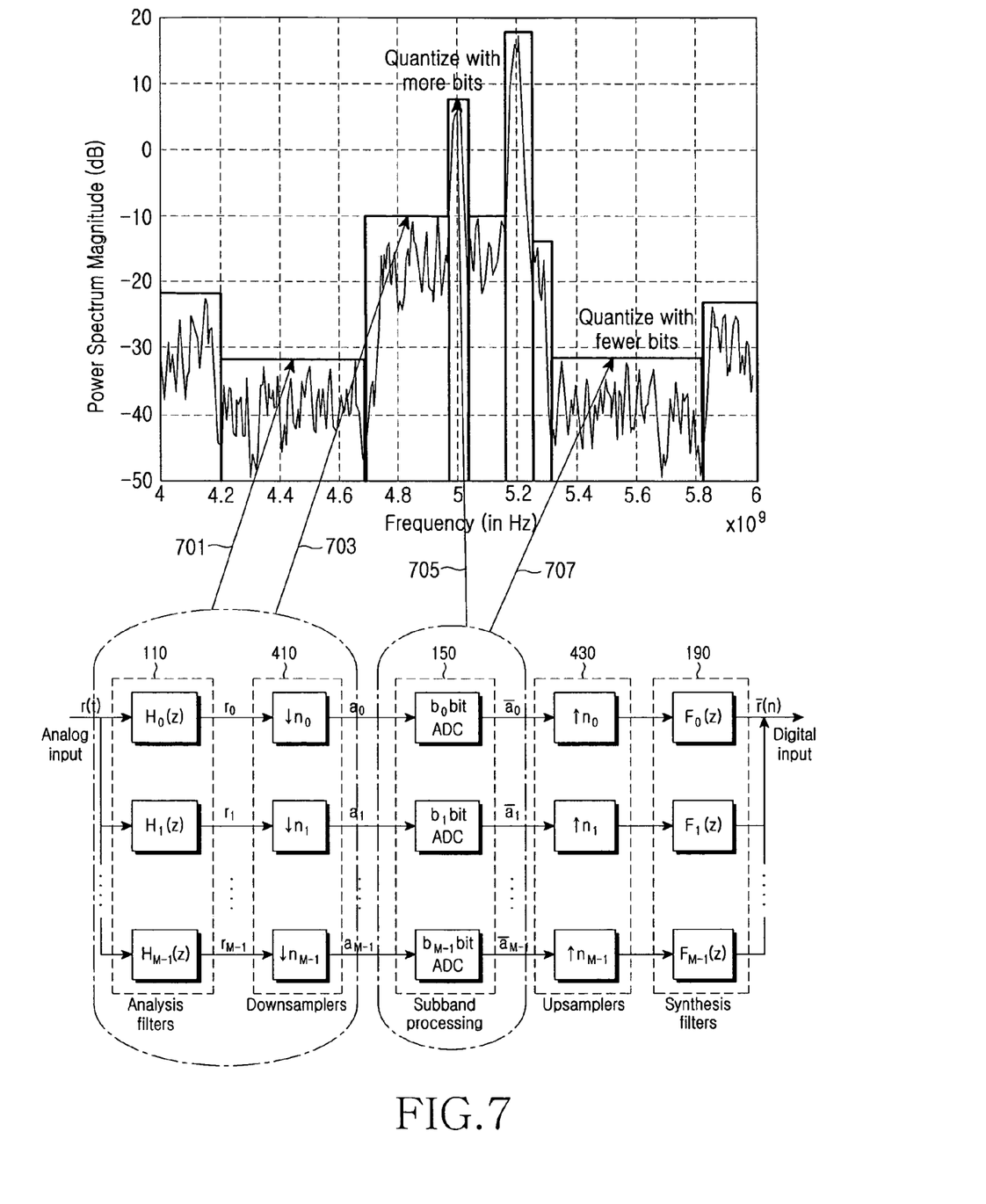

Reference will now be made to the results of simulations for the present invention with reference to FIGS. 5 to 7.

Figure 5:
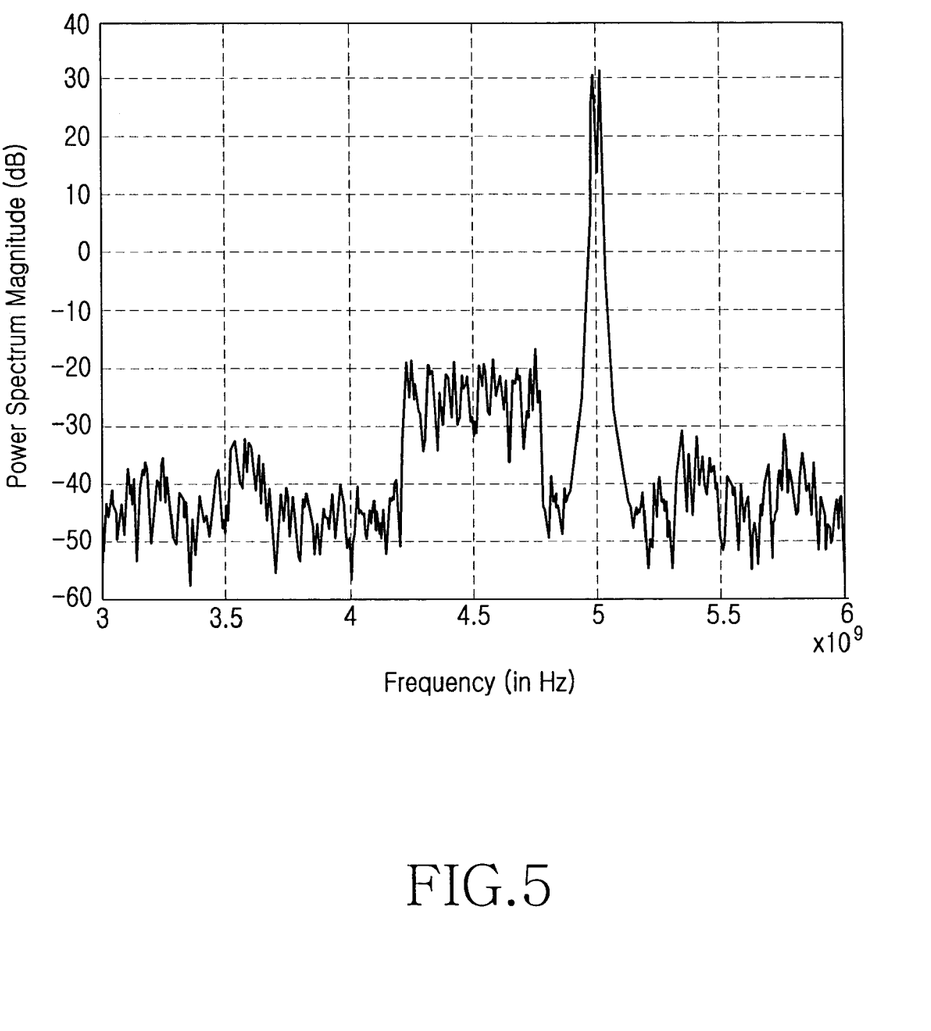
FIGS. 5 to 7 are waveform diagrams representing results of performance simulations for the present invention.

FIG. 5 is an example of simulation in which the input signal r(t) is composed of an OFDM signal, a WLAN signal and an AWGN signal. In this simulation, a signal of UWB (Ultra-Wideband) Group 1, which is used as the OFDM signal, has a center frequency of 4.48 GHz, and the WLAN signal has a center frequency of 5 GHz, a bandwidth of 20 MHz and a power level of 40 dB greater than that of the UWB signal. Further, the AWGN signal used, has a power level smaller than that of the UWB signal by 10 dB. Further, the quantization bit is set to 8 bits in PCM (Pulse Code Modulation). If the ADC according to the present invention, as described in FIG. 3 or 4, is used under these simulation conditions, it will be noted that the distortion gain GD becomes greater as the number of sub-bands increases, as illustrated in FIG. 6. Referring to FIG. 6, distortion is reduced by 9 dB when the number of sub-bands is 4 while distortion is reduced by 22 dB when the number of sub-bands is 16. In FIG. 7, reference numerals "701" to "707" show that a sampling rate and an ADC quantization bit are adaptively set during the multi-standard signal processing according to the operation of the ADC described in FIG. 4.

As described above, according to the present invention, multi-standard radio signals can be processed into digital signals in a receiver to which SDR is applied, and quantization distortion can be reduced during the procedure of converting the radio signal into the digital signal.

Further, the present invention can improve flexibility of a receiver in a wireless communication system by optimizing an ADC sampling rate and a quantization bit according to different input signal waveforms.

Further, since an input signal is processed into sub-band signals, the present invention can provide not only an analog-to-digital conversion technology applicable to cognitive radios which require interference suppression, but also an analog-to-digital conversion technology applicable to the IEEE 802.22 standard which requires wideband signal processing.

While the invention has been shown and described with reference to certain preferred embodiments thereof, it will be understood by those skilled in the art that various changes in form and details may be made therein without departing from the spirit and scope of the invention as further defined by the appended claims.

What is claimed is:

1. A method for performing analog-to-digital conversion in a receiver supporting software defined multi-standard radios, the method comprising the steps of:
   filtering an input analog signal into a plurality of sub-band signals;
   down-sampling the sub-band signals;

allocating quantization bits for the sub-band signals, respectively, and digitalizing the sub-band signals by using the allocated quantization bits;

up-sampling the digitalized sub-band signals; and reconstructing the sub-band signals into one digital signal, wherein, in the step of digitalizing the sub-band signals, the quantization bits are set based on a variance of the sub-band signals and a down-sampling rate.

2. The method as claimed in claim 1, wherein, in the step of down-sampling the sub-bands signals, a sampling rate of the sub-band signals is set according to types of the input analog signals.

3. The method as claimed in claim 1, wherein, when the sub-band signals are $r_k$ (k=0 to M−1), the number of the sub-band signals is assumed as M, a parameter determining the down-sampling rate is assumed as $n_k$, and the variance of the sub-band signals is assumed as $\sigma^2$, the quantization bits for the respective sub-band signals, $b_k$ (k=0 to M−1), are determined by:

$$b_k = b + \frac{1}{2}\log_2\left[\frac{\sigma_{r_k}^2}{\prod_{j=0}^{M-1}(\sigma_{r_j}^2)^{1/n_k}}\right], \sum_{k=0}^{M-1}\frac{b_k}{n_k} = b.$$

4. An apparatus for performing analog-to-digital conversion in a receiver supporting software defined multi-standard radios, the apparatus comprising:

a first filter unit for filtering an input analog signal into a plurality of sub-band signals;

a down-sampler unit for down-sampling the sub-band signals;

a sub-band processor unit for allocating quantization bits for the sub-band signals, respectively, and digitalizing the sub-band signals by using the allocated quantization bits;

an up-sampler unit for up-sampling the digitalized sub-band signals; and a second filter unit for filtering the sub-band signals such that the sub-band signals are converted into one digital signal, wherein the sub-band processor unit sets the quantization bits based on a variance of the sub-band signals and a down-sampling rate.

5. The apparatus as claimed in claim 4, wherein the down-sampler unit sets a sampling rate of the sub-band signals according to types of the input analog signals.

6. The apparatus as claimed in claim 4, wherein, when the sub-band signals are $r_k$ (k=0 to M−1), the number of the sub-band signals is assumed as M, a parameter determining the down-sampling rate is assumed as $n_k$, and the variance of the sub-band signals is assumed as $\sigma_r^2$, the quantization bits for the respective sub-band signals, $b_k$ (k=0 to M−1), are determined by:

$$b_k = b + \frac{1}{2}\log_2\left[\frac{\sigma_{r_k}^2}{\prod_{j=0}^{M-1}(\sigma_{r_j}^2)^{1/n_k}}\right], \sum_{k=0}^{M-1}\frac{b_k}{n_k} = b.$$

* * * * *